US006617029B2

United States Patent
Hwang et al.

(10) Patent No.: US 6,617,029 B2
(45) Date of Patent: Sep. 9, 2003

(54) NITROGEN-CONTAINING FLAME RETARDING EPOXY RESIN AND AN EPOXY RESIN COMPOSITION CONTAINING THE SAME

(75) Inventors: Kuen-Yuan Hwang, Hsinchu Industrial District (TW); Hong-Hsing Chen, Hsinchu Industrial District (TW); Chih-Fu Chen, Hsinchu Industrial District (TW); Huan-Chang Chao, Hsinchu Industrial District (TW)

(73) Assignee: Chang Chun Plastics Co., Ltd., Taipei (TW)

( * ) Notice: Subject to any disclaimer, the term of this patent is extended or adjusted under 35 U.S.C. 154(b) by 0 days.

(21) Appl. No.: 10/035,238

(22) Filed: Jan. 4, 2002

(65) Prior Publication Data

US 2003/0099839 A1 May 29, 2003

(30) Foreign Application Priority Data

Aug. 31, 2001 (TW) ........................ 90121704 A

(51) Int. Cl.$^7$ .................. B32B 27/38; C09K 21/10; C08L 63/00; C08G 59/00; C08G 14/10
(52) U.S. Cl. .................. 428/413; 252/601; 252/609; 525/482; 525/490; 528/116; 528/118; 528/163
(58) Field of Search ................... 428/413; 525/480, 525/481, 482, 490; 528/163, 87, 116, 118; 252/601, 609

(56) References Cited

U.S. PATENT DOCUMENTS 6,515,047 B2 * 2/2003 Fukuzawa et al. .......... 523/457

FOREIGN PATENT DOCUMENTS

| EP | 0 877 040 A1 | 11/1998 |
| JP | 6-31276 | 4/1994 |
| JP | 2000-297284 | 10/2000 |

* cited by examiner

Primary Examiner—Robert Dawson
Assistant Examiner—Michael J. Feely
(74) Attorney, Agent, or Firm—Bacon & Thomas

(57) ABSTRACT

The present invention relates to a nitrogen-containing epoxy resin of the following formula:

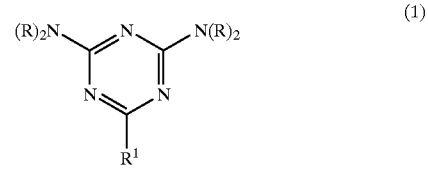

(1)

wherein R's are the same or different and each represents a hydrogen atom or —$R^{13}$—$C_{6-10}$ aryl-($OR^{14}$)p, and the aryl group is optionally substituted with $C_{1-6}$ alkyl group, in which $R^{13}$ represents a $C_{1-6}$ alkylene group or a phenylene —$CH_2$— group optionally substituted with a hydroxy group, $R^{14}$ represents a glycidyl group, and p is an integer of 1 or 2, provided that at least one R group is not a hydrogen atom; $R^1$ represents a phenyl group or —N(R)$_2$ group in which R is defined as above. The resin is produced from sequentially reacting melamine derivatives with aldehydes, phenolic compounds, and epihalohydrin. The nitrogen-containing epoxy resin, alone or as part of an epoxy resin composition, provides excellent flame-retardant and heat-resistant properties without using halogen or diantimony trioxide; hence, the resin and its composition are favorable as encapsulating materials for semiconductor applications.

21 Claims, No Drawings

NITROGEN-CONTAINING FLAME RETARDING EPOXY RESIN AND AN EPOXY RESIN COMPOSITION CONTAINING THE SAME

FIELD OF THE INVENTION

The present invention relates to a nitrogen-containing flame retarding epoxy resin and their composition comprising the nitrogen-containing flame retarding epoxy resin.

BACKGROUND OF THE INVENTION

Under the consideration of economics and productivity, an encapsulating material for currently semiconductor devices is an epoxy-based resin composition. To insure the use safety. electronic parts for the semiconductor are required to meet a flame retarding specification regulated by the UL. The approach to attain the flame retarding specification is addition of halogen-containing epoxy resin and diantimony trioxide as a flame retarding assistant into epoxy resin compositions for encapsulating electronic parts. However it is known that such flame retarding assistants are harmful to human and animal. For example. Diantimony trioxide has been classified a cancerous material while an epoxy resin containing halogen such as bromine will produce corrosive bromine free radical and hydrogen bromide during burning. Also, an aryl compound containing high content bromine will produce toxic brominated furanes and brominated dioxins compounds. Such toxic material have adverse effects to human, animal and environment. Thus, it is eagerly required to semiconductor manufacture for developing a novel epoxy resin without halogen neither diantimony trioxide to resolve the problems associated with the use of halogen-containing epoxy resin and diantimony trioxide.

For flame retarding resins, a nitrogen-containing compound is widely used as a new generation flame retarding agent. Among others, examples of commonly used flame retarding agents include non-reactive type nitrogen-containing compounds such as melamine, and triazine-containing cyanate, and non-reactive phosphorus-containing compounds such as red phosphorus, triphenyl phosphate (TPP), tricresyl phosphate (TCP), and poly(ammonium phosphate), and non-reactive nitrogen-containing flame retarding agent such as melamine dimer and trimer. To attain desired flame retarding effect is required to incorporating such non-reactive flame retarding agent in a large amount to epoxy resin composition formulations, which will cause the lowing of relative amount of the epoxy resin and the curing agent contained in the formulation so that the performances of the epoxy formulation will decrease.

Recently, under the considerations of environmental protection and safety, a reactive type resin flame retarding agent is used to substitute for currently used flame retarding agent. Since reactive nitrogen-containing flame retarding resin can react with other components and has better heat stability, it is widely used to substitute for halogen-containing resin. For example, Japan Unexamined Patent Publication No. 2000-297284 discloses a reactive type nitrogen-containing flame retarding agent which is a product from reacting a triazine compound and formaldehyde. Japan Examined Patent Publication No. Hei 6-31276 discloses a phosphorous-containing organic cyclic compound as a flame retarding agent. In addition, EP 0877040A1 discloses a novolac phenolic resin composition containing triazine ring possessing a flame retarding property. Such reactive type nitrogen-containing compounds have widely been used as a flame retarding agent in resin composition to be required a flame retarding property for electronic parts. Currently, the development of such reactive type nitrogen-containing flame retarding resin is mainly novolac-based resin, but for semi-conductor encapsulating, such a novolac-based resin composition can not improve a flame retarding property of the resin composition due to its low addition proportion.

To overcome the disadvantages associated with the current semiconductor encapsulating technique, the present inventors have investigated on epoxy resin and then developed a modified nitrogen-containing epoxy resin. Thus the present invention is completed.

The nitrogen-containing epoxy resin of the present invention has excellent flame retardant effect and heat resistance, it is therefore useful as an encapsulating material or semiconductor and imparts the encapsulated article with excellent flame retardant effect and heat resistance. Further, the nitrogen-containing epoxy resin of the present invention is also useful as a flame retarding agent or stabilizer for resin other than epoxy resin, such as thermoset and thermoplastic resin and is useful for producing various electronic products.

DETAILED DESCRIPTION OF THE PRESENT INVENTION

The present invention relates to a nitrogen-containing epoxy resin of the following formula:

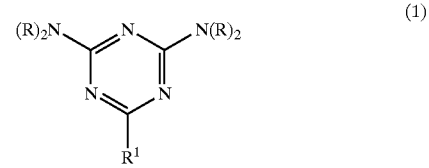

(1)

wherein R's are the same or different and each represents a hydrogen atom or —$R^{13}$—$C_{6\text{-}10}$ aryl-$(OR^{14})_p$, and the aryl group is optionally substituted with $C_{1\text{-}6}$ alkyl group, in which $R^{13}$ represents a $C_{1\text{-}6}$ alkylene group or a phenylene —$CH_2$— group optionally substituted with a hydroxy group, $R^{14}$ represents a glycidyl group, and p is an integer of 1 or 2, provided that at least one R group is not a hydrogen atom; $R^1$ represents a phenyl group or —$N(R)_2$ group in which R is defined as above;

which is produced from reacting melamine derivatives sequential with aldehydes, phenolic compound and epihalohydrin.

The present invention also relates to a flame retarding epoxy resin composition comprising the nitrogen-containing epoxy resin of the present invention.

The present invention further relates to a flame retarding epoxy resin composition comprising the nitrogen-containing epoxy resin of the present invention and a phosphorous-containing, flame retarding agent:

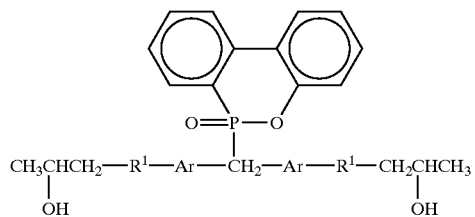

wherein $R^1$ represents —O—, —$NiH_2$—, —S—, —COO—, —$SO_2$—, —CO—, $CH_2CON<$; Ar represents a phenylene group, a biphenylene group, a bisphenol divalent group, a polyphenol divalent group, a divalent group selected from the following formulae:

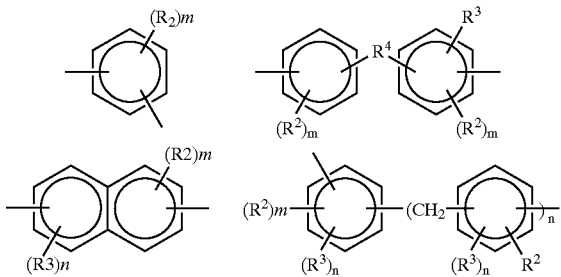

wherein $R^2$ represents a hydrogen atom, a $C_{1-6}$ alkyl or $C_{1-6}$ aryl;

$R^3$ represents —OH, —$NH_2$, —SH, —COOH, —$SO_3H$, —CHO, —$NHCOCH_3$;

$R^4$ represents —$CH_2$—, —$(CH_3)_3C$—, —$SO_2$—, —CO—, —O—;

m represents an integer of 0 to 2, and n represents an integer of 1 to 20.

Furthermore, the present invention also relates to the use of the present nitrogen-containing epoxy resin as a flame retarding agent or stabilizer for resin material other than epoxy resin which is in turn useful for producing various electronic products.

The term "$C_{1-6}$ alkyl group" used herein means a liner or branched alkyl group having 1 to 6 carbon atoms such as methyl, ethyl, n-propyl, isopropyl, n-butyl, s-butyl, t-butyl, n-pentyl, isopentyl, n-hexyl and isohexyl and the like. The term "$C_{1-6}$ alkylene group" used herein means a residue obtained by subtracting two hydrogens atom from a linear or branched alkane having 1 to 6 carbon atoms.

The term "$C_{1-6}$ aryl group" used herein means an aryl group having from 6 to 12 carbon atoms, such as phenyl group, naphthyl group, and biphenyl group and the like.

The term "arylene group" used herein means a residue obtained by subtracting two hydrogens atom from an aromatic hydrocarbon.

The term "$C_{1-6}$ aryl group" used herein means an aryl group having from 6 to 12 carbon atoms, such as phenyl group, naphthyl group, and the like.

The flame retarding nitrogen-containing epoxy resin according to the present invention is prepared from reacting melamine derivatives sequential with aldehydes of formula $R^{12}COH$, functional-containing benzene compound and epihalohydrin. Thus, the present invention also relates to a process for producing a flame retarding nitrogen-containing epoxy resin, the process comprises:

(a) reacting melamine derivatives of following formula (2):

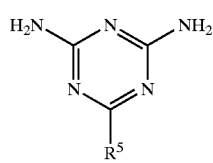

(2)

(in which $R^5$ represents —NH, or a phenyl group), with aldehydes of formula $R^{12}$ COH (in which $R^{12}$ represents $C_{1-6}$ alkyl group or unsubstituted or hydroxy-substituted phenyl group) in a suitable reaction solvent at a temperature of from 40 to 150° C., preferably at a temperature of from 60 to 100° C., to give a hydroxy-containing triazine derivative containing a functional group of the formula —$NHCR^{12}HOH$; and (b) dehydrating the resultant hydroxy-containing triazine derivative with phenolic compound in the presence of acidic catalyst at a temperature of from 50 to 200° C., preferably at a temperature of from 80 to 150° C., to give hydroxy- and aryl-containing triazine derivative;

(c) epoxizating the resultant hydroxy- and aryl-containing triazine derivative with epihalohydrin in the presence of a base to give the flame retarding nitrogen-containing epoxy resin of the present invention.

In the step (a), the mole ratio of melamine derivatives of formula (2) to aldehydes of formula $R^{12}COH$ is from 0.1 to 1.5, preferably from 0.3 to 1.0.

Examples of the aldehydes suitable in the present invention include formaldehyde, acetaldehyde, propionaldehyde, butylaldehyde, pentaldehyde, benzaldehyde, 2-hydroxybenzaldehyde, and 4-hydroxybenzaldehyde, and the like.

Examples of the solvents suitable in the step (a) include alcohols and aromatic hydrocarbon solvents including, but not limited to, methanol, ethanol, propanol, isopropanol, butanol, t-butanol, methoxyethanol, ethoxyethanol, butoxyethanol, methoxyisopropanol, ethoxyisopropanol, butoxyisopropanol, and the like; and benzene, toluene, and xylene, and the like.

In the step (b), the mole ratio of the resultant hydroxy-containing triazine derivative to the phenolic compound is from 0.02 to 0.5.

Examples of the phenolic compound suitable in the step (b) include, but not limited to, phenol, o-hydroxycresol, m-hydroxycresol, p-hydroxycresol, o-cresol, m-cresol, p-cresol, o-isopropylphenol, m-isopropylphenol, p-isopropylphenol, o-t-butylphenol, m-t-butylphenol, p-t-butylphenol, 2-methyl-4-t-butylphenol, 2-methyl-6-t-butylphenol, 3-methyl-6-t-butylphenol, bisphenol, bisphenol-A, bisphenol-F, bisphenol-S, naphthol, benzoic acid, 2-hydroxybenzoic acid, 4-hydroxybenzoic acid, terephthalic acid, and the like. Among others, phenol, o-hydroxycresol, m-hydroxycresol, o-cresol, m-cresol, p-cresol, o-t-butylphenol, m-t-butylphenol, p-t-butylphenol, 2-methyl-4-t-butylphenol, 2-methyl-6-t-butylphenol, 3-methyl-6-t-butylphenol, bisphenol, bisphenol-A, bisphenol-F, bisphenol-S, naphthol, benzoic acid, 2-hydroxybenzoic acid, and 4-hydroxybenzoic acid, and the like.

Also, the reaction between the hydroxy-containing triazine derivative with the phenolic compound occurs at the para-position or meta-position relative to the hydroxy group of the phenolic compound.

Examples of the acidic catalyst for the dehydrating reaction in the step (b) include, but not limited to, oxalic acid, hydrochloric acid, sulfuric acid, sulfurous acid, nitric acid, nitrous acid, chloric acid, perchloric acid, hypochloric acid, phosphoric acid, phosphorous acid, methanesulfonic acid, ethanesulfonic acid, benzenesulfonic acid, p-toluenesulfonic acid, dimethyl sulfate, diethyl sulfate, and the like. Among others, oxalic acid, hydrochloric acid, sulfuric acid, benzenesulfonic acid, p-toluenesulfonic acid, dimethyl sulfate, diethyl sulfate are preferable. The amount of the acidic catalyst is from 0.0001 to 0.001 mole per mole of the phenolic compound.

In the step (c), the mole ratio of the hydroxy- and aryl-containing triazine to epihalohydrin is from 0.02 to 0.2.

Examples of epihalohydrin used in the step (c) include epihalohydrin, epibromohydrin, and the like. Examples of the base suitable in the step (c) include sodium hydroxide, and the like. The mole ratio of the base to the epihalohydrin is from about 0.01 to 1.0.

The flame retarding nitrogen-containing epoxy resin of the present invention has a high nitrogen content thus possesses excellent flame retarding effect and heat resistance, it therefore can be used as an epoxy resin for producing semiconductor encapsulating material. It can also be incorporated into other thermoset and thermoplastic resin material to produce various electronic products.

Accordingly, the present invention also relates to a use of the flame retarding nitrogen-containing epoxy resin of the present invention as a flame retarding agent in either thermoset or thermoplastic resin.

Examples of the thermoset resin in which the flame retarding nitrogen-containing epoxy resin of the present invention is suitable include, such as, epoxy resin and novolac resin, and the like. Examples of the thermoplastic resin in which the flame retarding nitrogen-containing epoxy resin of the present invention is suitable include, such as, polystyrene, polypropylene, polyterephthalate, polycarbonate, polystyrene, styrene-butadiene-styrene copolymer, acrylonitrile-butadiene-styrene copolymer, polyamide, polyamide, polysulfone, polyether sulfone, polyphenylene oxide, polyphenylene sulfide, and the like.

The present invention further relates to a flame retarding epoxy resin composition, which comprises the flame retarding nitrogen-containing epoxy resin of the present invention, a curing agent containing reactive hydrogen capable to react with an epoxy group, and a curing promoter.

The curing agent containing reactive hydrogen capable to react with an epoxy group used in the flame retarding epoxy resin composition, hereinafter referred to "the curing agent", can be various halogen-free curing agent, and includes bisphenol resin, polyhydroxy phenol resin, phenolic resin, and anhydride, and the like.

Examples of the bisphenol resin include compound of the formula HO—Ph—X—Ph—OH (wherein Ph represents a phenylene group, X= a bond, —CH$_2$—C(CH$_3$)$_2$—, —O—, —S—, —CO— or —SO$_2$—). Embodiments of the bisphenol resin include, but not limited to, tetramethylbisphenol AD, tetramethylbisphenol S, 4,4'-biphenol, 3,3'-dimethyl-4,4'-biphenol, or 3,3',5,5'-tetramethyl-4,4'-biphenol, and the like.

Examples of the polyhydroxy phenol resin include, but not limited to, tris(4-hydroxyphenyl)methane, tris(4-hydroxyphenyl)ethane, tris(4-hydroxyphenyl)propane, tris(4-hydroxyphenyl)butane, tris(3-methyl-4-hydroxyphenyl) methane, tris(3,5-dimethyl-4-hydroxyphenyl)methane, tetrakis(4-hydroxyphenyl)methane, tetrakis(3,5-dimethyl-4-hydroxyphenyl)methane, and the like.

Examples of the phenolic resin include phenol-formaldehyde condensate cresol-phenolic condensate, bisphenol A-phenolic condensate and dicyclopentadiene-phenolic condensate, and the like.

Examples of the anhydrides include, such as 3,3',4,4'-benzophenonetetracarboxylic anhydride (BTDA), trimetallitic acid trianhydride (BTDA) and pyromellitic acid dianhydride, and the like.

The curing agent used in the flame retarding epoxy resin composition of the present invention can be a nitrogen- and phosphorus-containing curing agent of the following formula:

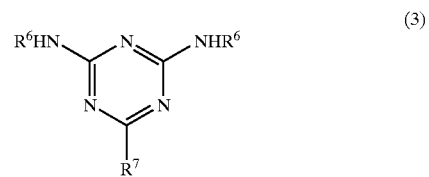

wherein $R^7$ represents a group of formula —NHR$^6$, C$_{1-6}$ alkyl group or C$_{1-6}$ aryl group; R$_6$ represents a hydrogen atom, a group of the formula —(CH$_2$—R$^8$)$_r$H, or a group of following formula (5), provided that at least one R$^6$ is not a hydrogen atom, in which R$^8$ represents a phenylene group, a naphthalene group, or a group of formula (4):

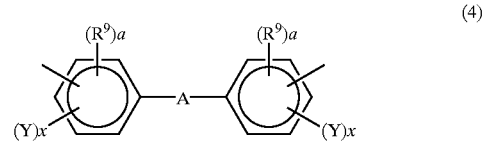

wherein r represents 0(zero) or an integral of from 1 to 20; A represents —O—, —S—, —SO$_2$—, —CO—, —CH$_2$—, —C(CH$_3$)$_2$— or a group of the following formula:

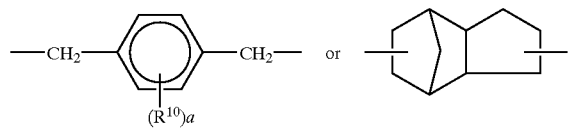

in which $R^9$ and $R^{10}$ independently represent a hydrogen atom, a C$_{1-10}$ alkyl group, or a C$_{1-6}$ aryl group; Y represents —OH, —NH$_2$, or —COOH; a represents 0(zero) or an integral of from 1 to 2; x represents 0(zero) or an integral of from 1 to 3;

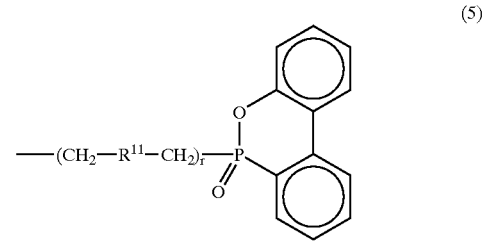

in which $R^{11}$ is defined as the definition for $R^8$ and r is defined as above.

The C$_{6-10}$ aryl group represented by $R^7$ and $R^{10}$ can further be substituted with one or more substitutents selected from the group consisting of a hydroxy group, an amino group, a carboxyl group, a C$_{1-6}$ alkyl group, and a combination thereof.

The term "aryl group" used herein includes phenyl group and naphthyl group.

Examples of the curing promoter used in the flame retarding epoxy resin composition of the present invention include tertiary amine, tertiary phosphine, quaternary ammonium salt, phosphornium salt, boron trifluoride complex, lithium compound or imidazole compound, or a combination thereof.

Examples of the tertiary amine include trimethylamine, triethylamine, diusopropyl ethylamine, dimethyl ethanolamine, diethylaniline, tris(N,N- dimethylaminomethyl)phenol, or N,N-dimethylaminomethyl, and the like.

Examples of the tertiary phosphine include triphenylphosphine.

Examples of the quaternary ammonium salt include tetramethylammonium chloride, tetramethylammonium bromide, triethylbenzylammonium chloride, triethylbenzylammonium bromide, or triethylbenzylammonium iodide, and the like.

Examples of the phosphornium salt include tetrabutylphosphomium chloride, tetrabutylphosphornium bromide, tetrabutylphosphornium iodide, tetrabutylphosphate acetate complex, tetraphenylphosphornium chloride tetraphenylphosphornium bromide, tetraphenylphosphornium iodide, ethyltriphenylphosphornium chloride, ethyltriphenylphosphornium bromide, ethyltriphenylphosphornium iodide, ethyltriphenylphosphate acetate complex, ethyltriphenylphosphate phosphate complex, propyltriphenylphosphornium chloride, propyltriphenylphosphornium bromide, propyltriphenylphosphornium iodide, butyltriphenylphosphornium chloride, butyltriphenylphosphornium bromide, and butyltriphenylphosphornium iodide, and the like.

Examples of the imidazole include, such as, 2-methylimidazole, 2-phenylimidazole, or 2-ethyl-4-methylimidazole, and the like.

These curing promoter can be used along or in a combination thereof.

The flame retarding epoxy resin composition of the present invention, in addition to the flame retarding nitrogen-containing epoxy resin of the present invention, can also comprise other conventional epoxy resin. Examples of the conventional resin include, such as, bisphenol glycidyl ether, bis(diphenol) glycidyl ether, resorcinol glycidyl ether, glycidyl ether of a nitrogen-containing ring, glycidyl ether of dihydroxynaphthalene, phenolic polyglycidyl ether, and polyhydroxy phenol polyglycidyl ether, and the like.

In the flame retarding epoxy resin composition of the present invention, the amount of the curing agent depends on the epoxy equivalent of the used epoxy resin and the active hydrogen equivalent of the curing agent. Generally, the ratio of the epoxy equivalent of the epoxy resin to the active hydrogen equivalent of the curing agent is from 1:0.5 to 1:1.5, preferably from 1:0.6 to 1:1.4, more preferably from 1:0.7 to 1:1.3.

When the flame retarding epoxy resin composition of the present invention contains both the flame retarding nitrogen-containing epoxy resin of the present invention and conventional epoxy resin, the amount of the conventional epoxy resin is from 1 to 95% by weight, preferably from 30 to 90% by weight, more preferably from 35 to 88% by weight, relative to the total weight of the epoxy resin contained in the flame retarding epoxy resin composition of the present invention. In the other hand, if the amount of the flame retarding nitrogen-containing epoxy resin of the present invention is less than 5% by weight, the resultant flame retarding property and heat resistance are insufficient.

In the flame retarding epoxy resin composition of the present invention, the amount of the curing promoter is from 0.01 to 5% by weight, preferably from 0.05 to 3% by weight, relative to the total weight of the flame retarding epoxy resin composition of the present invention. If the amount of the curing promoter is more than 5% by weight, although it causes shorten reaction time, it easily produces byproducts, which adversely affects the electronic property, moisture resistance, water absorbability in the final use. If the amount is less than 0.01% by weight, the reaction rate is too low so that the production is inefficient.

The amount of the curing promoter also depends on a gelling time and viscosity of the flame retarding epoxy resin composition of the present invention. Generally, the curing promoter is added in an amount that controls the gelling time of the flame retarding epoxy resin composition of the present invention in the range of 30 to 500 sec/171° C., and the viscosity of the flame retarding epoxy resin composition of the present invention in the range of 20 to 500 cps/25° C.

The flame retarding epoxy resin composition of the present invention further comprises other additives, for example, such as inorganic filler, coupling agent, pigment (e.g. carbon black and ferrous oxide), molding release agent and low stress additives.

Examples of the inorganic filler suitably used in the flame retarding epoxy resin composition of the present invention include sphere type and cornered type molten silica, crystalline silica, and the like, and quartz glass powder, talc powder, alumina powder, zinc borate, aluminum hydroxide, magnesium hydroxide, calcium carbonate, aluminum nitride, and the like. These filler can be used alone or in a combination thereof. With the cornered type molten silica, crystalline silica, and a mixture of the cornered type molten silica and crystalline silica are preferred.

An average particle size of these inorganic filler is preferably from 1 to 30 micron. If the average particle size is less than 1 micron, it will cause the increasing viscosity and decreasing flowability of the resin composition. If the average particle size is more than 30 micron, it will cause uneven dispersion of the resin and of the filler in the epoxy resin composition, which will in turn cause resin overflowing during encapsulating application and affect physical property of the cured article. Additionally, the maximum particle size is preferably less than 150 micron to avoid causing a narrow casting channel or poor filling of voids.

The amount of the inorganic filler is from 60 to 92% by weight, preferably from 65 to 90% by weight based on the total weight of the flame retarding epoxy resin composition of the present invention. If the amount of the inorganic filler is less than 60% by weight, the relative ratio of the epoxy resin in the resin composition will be increased so that an overflowing of the resin easily occurs during encapsulating. If the amount of the inorganic filler is more than 92% by weight, a viscosity of the resin composition will increase and result in the decrease of flowability.

The present invention will further illustrate by reference to the following synthesis examples, working examples, and comparative examples, However, these synthesis examples and working examples are not intended to be limiting of the scope of the present invention.

The epoxy equivalent weight (EEW), the viscosity, and a soften point used herein are determined according to the following methods:

(1) Epoxy Equivalent Weight (EEW): The epoxy equivalent weight (EEW) is determined according to the method of ASTM 1652, the epoxy resin to be tested is dissolved in a mixture solvent of chlorobenzene:chloroform in a weight ratio of 1:1, the resultant mixture is titrated with HBr/galacial acid by using crystalline violet as an indicator.

(2) Viscosity: The viscosity is determined by placing the epoxy resin to be tested in a thermostat maintaining at 25° C. for 4 hours and measuring the viscosity by using Brookfield Viscosmeter at 25° C.

(3) Soften point: The soften point is determined by applying the epoxy resin to be tested on an O-ring, placing a ball on the applied epoxy resin gradually heating the epoxy resin, and measuring the temperature when the ball falls into the O-ring.

Each ingredients used in these synthesis examples, working examples, and comparative examples are illustrated as follows.

Epoxy resin A: cresol-phenolic condensate having an epoxy equivalent weight of 200 to 220 gram/equivalent and a hydrolyzable chlorine of below 200 ppm, under trade name of CNE 200ELB sold and manufactured by Chang Chun Plastic Co., Ltd., Taiwan. R.O.C.

Epoxy resin B: 3,3',5,5'-tetramethyl-4,4'-biphenol having an epoxy equivalent weight of 195 grain/equivalent, under trade name of YX4000H sold and manufactured by Yuka Shell Epoxy Co. Ltd., Japan.

Epoxy resin C: a diglycidyl ether of tetrabromobisphenol A having an epoxy equivalent weight of 330 to 350 gram/equivalent, under trade name of BEB350 sold and manufactured by Chang Chun Plastic Co., Ltd., Taiwan, R.O.C.

Curing agent A: a curing agent having reactive hydrogen of 105 to 110 gram/equivalent, under trade name of PF-5110 sold and manufactured by Chang Chun Plastic Co., Ltd., Taiwan, R.O.C.

Curing agent B: a nitrogen- and phosphorus-containing curing agent prepared from the following Synthesis Example 3.

Curing promoter A: triphenylphosphine.

Curing promoter B: 2-methylimidazole (hereinafter referred to 2MI).

SYNTHESIS EXAMPLE 1

Preparation of Epoxy Resin D 126 grams of melamine, 240 grams of 37% aqueous formaldehyde, and 240 grams of methanol were charged into a 3 liters 5-neck flask equipped with electronic heating housing, thermostat, electronic stirrer, nitrogen inlet, thermocouple, water cooling condenser, and added funnel. The mixture was stirred with heating until all components were dissolved, The mixture was heated at a temperature at 60° C. for 1 hour. Into the resultant mixture were added 282 grams of phenol and 1.3 grams hydrochloric acid and then heated at a temperature of 80° C. for 4 hours to subject to dehydration. The resulting mixture was heated to recover methanol and $H_2O$ to give 409 grams hydroxy- and phenyl-containing triazine compound, which nitrogen content was analyzed to be about 20.5%.

100 grams of the hydroxy- and phenyl-containing triazine compound and 555 grams epihalohydrin were added into a glass reactor and stirred with heating to dissolve completely. Into the resultant mixture was added 77.9 grams of 49.5% aqueous sodium hydroxide at a temperature of 70° C. in a reduced pressure of 200 mmHg over 4 hours and continued to react for further 1 hour. After the reaction completed, the mixture was heated to recover epihalohydrin. Into the residue were added solvent and water to remove salted water and a resin was filtered out. Solvent was distillated off to give 138 grams of the flame retarding epoxy resin composition of the present invention (hereinafter referred to epoxy resin D), which nitrogen content is analyzed to be 14.9% and epoxy equivalent weight is analyzed to be 205 grams/equivalent.

SYNTHESIS EXAMPLE 2

Preparation of Epoxy Resin E 126 grams of melamine, 486 grams of 37% aqueous formaldehyde, and 486 grams of butanol were charged into a 3 liters 5-neck flask equipped with electronic heating housing, thermostat, electronic stirrer, nitrogen inlet, thermocouple, water cooling condenser, and added tunnel. The mixture was stirred with heating until all components were dissolved. The mixture was heated at a temperature at 75° C. for 1 hour. Into the resultant mixture were added 648 grams of o-cresol and 1.3 grams hydrochloric acid and then heated at a temperature of 85° C. for 4 hours to subject to dehydration. The resulting mixture was heated to recover butanol and $H_2O$ to give 770 grams hydroxy- and phenyl-containing triazine compound, which nitrogen content was analyzed to be about 10.9%.

130 grams of the hydroxy- and phenyl-containing triazine compound and 555 grams epichlorohydrin were added into a glass reactor and stirred with heating to dissolve completely. Into the resultant mixture was added 77.9 grams of 49.5% aqueous sodium hydroxide at a temperature of 70° C. in a reduced pressure of 200 mmHg over 4 hours and continued to react for further 1 hour. After the reaction completed, the mixture was heated to recover epichlorohydrin. Into the residue were added solvent and water to remove salted water and a resin was filtered out. Solvent was distillated off to give 182 grams of the flame retarding epoxy resin composition of the present invention (hereinafter referred to epoxy resin E), which nitrogen content is analyzed to be 7.8% and epoxy equivalent weight is analyzed to be 235 grams/equivalent.

SYNTHESIS EXAMPLE 3

Preparation of Phosphorus-containing Epoxy Resin F 400 grams 1 HCA (which formula was shown below) and 100 grams of the epoxy resin A were charged into a 3 liters 5-neck flask equipped with electronic heating housing, thermostat, electronic stirrer, nitrogen inlet, thermocouple, water cooling condenser, and added funnel. The mixture was purged of nitrogen and heated at a temperature of 120° C. to completely dissolve the HCA and the epoxy resin A. The mixture was dried under a vacuum, purged of nitrogen, and vacuumed again. The procedures were repeated 2 times. After a temperature of the flask was lowered to a temperature of 85 to 90° C., 6 grams of catalyst ethyl triphenyl phosphate acetate complex. The content was stirred under an atmosphere of nitrogen to dispense evenly. The resultant mixture was heated to 160° C. for 10 minutes and found exothermic reaction occurring. The temperature of the reaction was increased to 180° C. and maintained at the temperature for 3 hours to give phosphorous-containing epoxy resin F, which epoxy equivalent was analyzed to be 453 gram/equivalent and a theory phosphorus content was to be 4.1%.

SYNTHESIS EXAMPLE 4

Preparation of Nitrogen- and Phosphorus-containing Curing Agent B 1410 grams of phenol (15 moles), 244.7 grams of 92% polyformaldehye (7.5 moles), 337 grams of benzoguanamine (1.8 moles), 259 grams of HCA (1.2 moles) and 11.2 glares of oxalic acid were into a 3 liters 5-neck flask equipped with electronic heating housing, thermostat, electronic stirrer, nitrogen inlet, thermocouple, water cooling condenser, and added funnel. After all ingredients were dissolved, the mixture was dried under a vacuum, purged of nitrogen, and vacuumed again. The flask temperature was raised to 100 to 110° C. and the reaction proceeded for 3 hours. The flask temperature was further raised to 120 to 125° C. and the reaction proceeded for 2 hours. After the reaction completed, unreacted phenol and $H_2O$ generated from the reaction were gradually distillated off at a normal atmosphere. The mixture was finally maintained at a temperature at 180° C. for 1 hour to give the desired nitrogen- and phosphorus-containing curing agent B. The nitrogen- and phosphorus-containing curing agent B was analyzed for its soften point to be 161° C. A theory nitrogen content was to be 10.0%, a theory phosphorus content was to be 4.1%, and reactive hydrogen equivalent was to be 210 grams/equivalent.

Note HCA is a phosphorus-containing compound is presented by the following formula:

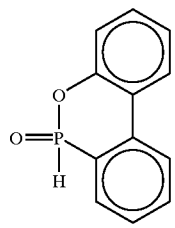

WORKING EXAMPLES AND COMPARATIVE EXAMPLES

Working Example 1

A Preparation of Flame Retarding Epoxy Resin Composition

The flame retarding epoxy resin composition of the present invention was prepared from the ingredients listed below.

| | |
|---|---|
| Epoxy resin A | 10.34 parts by weight |
| Epoxy resin D | 6.00 parts by weight |
| Curing agent A | 7.80 parts by weight |
| Curing promoter A | 0.26 parts by weight |
| Silane coupling agent | 0.60 parts by weight |
| Silicone dioxide | 74.0 parts by weight |
| Carbon black | 0.40 parts by weight |
| Carnauba wax | 0.60 parts by weight |

All ingredients were charged into a container and throughly stirred by a mechanical stirrer. The mixture was kneaded at a temperature of 95° C. by using a dual screw roller, cooled and pulverized to obtain the flame retarding epoxy resin composition of the present invention for semiconductor encapsulating.

WORKING EXAMPLES 2 TO 9 AND COMPARATIVE EXAMPLES 1 to 3

Following the procedures of the work example 1, the epoxy resin compositions of working examples 2 to 9 and comparative examples were prepared from the ingredients and its amount listed in Table 1.

TABLE 1

| | Working Example | | | | | | | | Comparative Example (parts by weight) | | |
|---|---|---|---|---|---|---|---|---|---|---|---|
| | 2 | 3 | 4 | 5 | 6 | 7 | 8 | 9 | 1 | 2 | 3 |
| Epoxy Resin A | 10.14 | 10.12 | — | 8.34 | — | 10.34 | 6.2 | 6.2 | 15.34 | — | 11.34 |
| Epoxy Resin B | — | — | 10.34 | — | 8.12 | — | 4.14 | 4.14 | — | 14.12 | — |
| Epoxy Resin C | — | — | — | — | — | — | — | — | — | — | 2.5 |
| Epoxy Resin D | 6.0 | 6.0 | 6.0 | — | — | 3.0 | 2.0 | 2.0 | — | — | — |
| Epoxy Resin E | — | — | — | 8.0 | 8.0 | — | 2.0 | 2.0 | 1.0 | — | — |
| Epoxy Resin F | — | — | — | — | — | 3.0 | 2.0 | 1.5 | — | — | — |
| $Sb_2O_3$ | — | — | — | — | — | — | — | — | — | — | 2.5 |
| Triphenyl phosphate | — | — | — | — | — | — | — | — | — | 3.0 | — |
| Red phosphorus | — | — | — | — | — | — | — | 0.5 | — | — | — |
| Curing agent A | 8.0 | 7.1 | 7.8 | 7.1 | 7.8 | 7.8 | 7.8 | 7.8 | 7.8 | 7.1 | 7.8 |
| Curing agent B | — | 1.0 | — | — | 1.0 | — | — | — | — | — | — |
| Curing promoter A | 0.26 | 0.13 | 0.26 | 0.26 | 0.13 | 0.26 | 0.26 | 0.26 | 0.26 | 0.13 | 0.26 |
| Curing promoter B | — | 0.05 | — | — | 0.05 | — | — | — | — | 0.05 | — |
| Silane coupling agent | 0.6 | 0.6 | 0.6 | 0.6 | 0.6 | 0.6 | 0.6 | 0.6 | 0.6 | 0.6 | 0.6 |
| Molten silicone dioxide | 74.0 | 74.0 | 74.0 | 74.0 | 74.0 | 74.0 | 74.0 | 74.0 | 74.0 | 74.0 | 74.0 |
| Carbon black | 0.4 | 0.4 | 0.4 | 0.4 | 0.4 | 0.4 | 0.4 | 0.4 | 0.4 | 0.4 | 0.4 |
| Carnauba wax | 0.6 | 0.6 | 0.6 | 0.6 | 0.6 | 0.6 | 0.6 | 0.6 | 0.6 | 0.6 | 0.6 |

Characteristics of the prepared epoxy resin compositions were determined according to the following methods and the results were shown in Table 2.

(1) Helix flowability: According to the method of EMMI-1-66, the epoxy resin composition to be tested was determined its helix flowability at 175° C. and 70 kg/cm². The results were shown in Table 2.

(2) Flame resistance: The epoxy resin composition to be tested were made into a sheet having a dimension of 5" length, 0.5" width, and 1/16" thick and tested its flame resistance according to UL 94 specification. Each of five sheets prepared from the same epoxy resin composition was burned twice and a burning time was recorded. The test was passed if a total burning time for 10 burnings did not exceed 50 seconds and each burning time did not exceed 10 seconds. The results were shown in Table 2. An average burning time was also calculated and shown in Table 3.

(3) Moisture absorption: A circular sheet having a diameter of 25 mm and a thickness of 5 mm was prepared from the epoxy resin composition to be tested and then weighted ($W_i$). The sheet was boiled in a boiling water at a temperature of 100° C. for 24 hours and weighted again ($W_e$). The moisture absorption is defined according following equation:

Moisture absorption=$(W_e-W_i)/W_i \times 100\%$ (4) Solder heat resistance: A 18-pin dual leadframe (18LD-PDIP) was encapsulating with the epoxy resin composition to be tested at 175° C. and cured at the same temperature for 4 hours. The cured article was treated under a condition of 85° C./85% for 7 hours and then heated in a solder tank at a temperature of 240° C. for 10 seconds three times. The cured article was visually examined whether crack occurred on the appearance.

Examples and Comparative Examples exhibit flame retardant and comparative flame resistance (except for Comparative Example 1), and pass the UL94 V-0 test without affecting helix flowability, the Working Examples 2 to 9 containing the flame retarding nitrogen-containing epoxy resin exhibit better solder resistance than the Comparative Examples.

Although Comparative Example 1 uses the flame retarding nitrogen-containing epoxy resin, it does not pass the UL94 V-0 test due to containing less than 5% by weight of the flame retarding nitrogen-containing epoxy resin.

The epoxy resin composition of Comparative Example 2 using a non-reactive flame retarding agent triphenyl phosphate passed the 94UL V-0 flame resistance test, but its flowability becomes poor and exhibits poor moisture absorption and poor solder heat resistance.

Comparative Example 3 uses conventional bromine-containing epoxy resin and Sb-containing flame retarding agent. To attain the desired flame resistance, the amounts of the bromine-containing epoxy resin and Sb-containing flame retarding agent should be increased so that the amount of usual epoxy resin will be decreased, which in turn results in poor flowability. The epoxy resin of the Comparative Example 3 exhibits a poorer solder heat resistance than the Working Examples of the present invention.

INDUSTRIAL UTILITY

The flame retarding nitrogen-containing epoxy resin of the present invention and an epoxy resin composition containing the same possess excellent flame retardants and heat resistance, therefore the flame retarding nitrogen-containing epoxy resin of the present invention and an epoxy resin composition containing the same are useful as an encapsulating material in the semiconductor industry without adding additional flame retarding agent. Also, the cured article prepared from the resin composition of the present invention exhibits excellent molding ability and excellent reliance.

TABLE 2

|  | Working Example |  |  |  |  |  |  |  | Comparative Example |  |  |
|---|---|---|---|---|---|---|---|---|---|---|---|
|  | 2 | 3 | 4 | 5 | 6 | 7 | 8 | 9 | 1 | 2 | 3 |
| Helix Flowability (cm) | 75 | 75 | 82 | 70 | 75 | 75 | 75 | 78 | 80 | 60 | 65 |
| Flame Resistance UL-94 | V-0 | V-0 | V-0 | V-0 | V-0 | V-0 | V-0 | V-0 | V-1 | V-0 | V-0 |
| Moisture Absorption | 0.28 | 0.28 | 0.27 | 0.28 | 0.28 | 0.26 | 0.27 | 0.29 | 0.25 | 0.37 | 0.24 |
| Solder Heat Resistance | 0/10 | 0/10 | 0/10 | 0/10 | 0/10 | 0/10 | 0/10 | 0/10 | 1/10 | 3/10 | 2/10 |
| Note |  |  |  |  |  |  |  |  |  | * | ** |

* poor flowability
** a bromine-containing formulation

In the Working Examples and Comparative Examples, Working Examples 2 to 9 contain the flame retarding nitrogen-containing epoxy resins D–E and/or F of the present invention and each Working Examples use various epoxy resins and curing promoters to prepare flame retarding epoxy resin compositions. Comparative Example 1 uses the flame retarding nitrogen-containing epoxy resins in an amount of less than 5% by weight. Comparative Example 2 uses non-reactive triphenyl phosphate flame retarding agent and Comparative Example 3 uses bromine-containing epoxy resin and Sb-containing flame retarding agent. From the above results, it is known that although all Working Moreover, due to the excellent flame retardance and heat resistance, the flame retarding nitrogen-containing epoxy resin of the present invention is useful for preparing resin reinforced material prepreg, laminate, printing circuit board, electronic encapsulating material, electric parts such as connector, transformer, power switch, relay, housing material, and coil material, electronic products, automobile products and machinery products, and the like.

What is claimed is:

1. Flame retarding nitrogen-containing epoxy resin of the following formula:

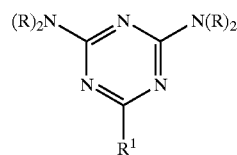

(1)

wherein R's are the same or different and each represents a hydrogen atom or —$R^{13}$-$C_{1-6}$ aryl-$(OR^{14})_p$, and the aryl group is optionally substituted with $C_{1-6}$ alkyl group, in which $R^{13}$ represents a $C_{1-6}$ alkylene group or a phenylene —$CH_2$— group optionally substituted with a hydroxy group, $R^{14}$ represents a glycidyl group, and p is an integer of 1 or 2, provided that at least one R group is not a hydrogen atom; $R^1$ represents a phenyl group or —$N(R)_2$ group in which R is defined as above.

2. A process for producing the flame retarding nitrogen-containing epoxy resin according to claim 1, which comprises the following steps:

(a) reacting melamine derivatives of following formula (2):

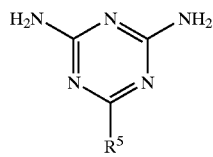

(2)

(in which $R^5$ represents —$NH_2$ or a phenyl group), with aldehydes of formula $R^{12}COH$ (in which $R^{12}$ represents $C_{1-6}$ alkyl group or unsubstituted or hydroxy-substituted phenyl group) in a suitable reaction solvent at a temperature of from 40 to 150° C., to give a hydroxy-containing triazine derivative containing a functional group of the formula —$NHCR^{12}HOH$; and (b) dehydrating the resultant hydroxy-containing triazine derivative with phenolic compound in the presence of acidic catalyst at a temperature of from 50 to 200° C., to give hydroxy- and aryl-containing triazine derivative;

(c) epoxizating the resultant hydroxy- and aryl-containing triazine derivative with epihalohydrin in the presence of a base to give the flame retarding nitrogen-containing epoxy resin of claim 1.

3. The process according to claim 2, wherein the mole ratio of melamine derivatives of formula (2) to aldehydes of formula $R^{12}COH$ is from 0.1 to 1.5 in the step (a).

4. The process according to claim 2, wherein the mole ratio of the resultant hydroxy-containing triazine derivative to the phenolic compound is from 0.02 to 0.5 in the step (b).

5. The process according to claim 2, wherein the mole ratio of the hydroxy- and aryl-containing triazine to epihalohydrin is from 0.02 to 0.2 in the step (c).

6. The process according to claim 2, wherein the aldehydes are one or more compounds selected from the group consisting of formaldehyde, acetaldehyde, propionaldehyde, butylaldehyde, pentaldehyde, benzaldehyde, 2-hyndroxybenzaldehyde, and 4-hydroxybenzaldehyde.

7. The process according to claim 2, wherein the phenolic compound are one or more compounds selected from the group consisting of phenol, o-hydroxycresol, m-hydroxycresol, p-hydroxycresol, o-cresol, m-cresol, p-cresol, o-isopropylphenol, m-isopropylphenol, p-isopropylphenol, o-t-butylphenol, m-t-butylphenol, p-t-butylphenol, 2-methyl-4-t-butylphenol, 2-methyl-6-t-butylphenol, 3-methyl-6-t-butylphenol, bisphenol, bisphenol-A, bisphenol-F, bisphenol-S, naphthol, benzoic acid, 2-hydroxybenzoic acid, 4-hydroxybenzoic acid, and terephthalic acid.

8. The process according to claim 2, wherein the acidic catalyst for the dehydrating reaction in the step (b) is one or more compounds selected from the group consisting of oxalic acid, hydrochloric acid, sulfuric acid, sulfurous acid, nitric acid, nitrous acid, chloric acid, perchloric acid, hypochloric acid, phosphoric acid, phosphorous acid, methanesulfonic acid, ethanesulfonic acid, benzenesulfonic acid, p-toluenesulfonic acid, dimethyl sulfate, and diethyl sulfate.

9. The process according to claim 8, wherein the amount of the acidic catalyst is from 0.0001 to 0.001 mole per mole of the phenolic compound.

10. The process according to claim 2, wherein the epihalohydrin used in the step (c) is epichlorohydrin and/or epibromohydrin.

11. A flame retarding epoxy resin composition comprising the flame retarding nitrogen-containing epoxy resin according to claim 1, a curing agent containing reactive hydrogen capable of reacting with an epoxy group, and a curing promoter.

12. The flame retarding epoxy resin composition according to claim 11, wherein the ratio of the epoxy equivalent of the epoxy resin to the active hydrogen equivalent of the curing agent is from 1:0.5 to 1:1.5.

13. The flame retarding epoxy resin composition according to claim 11, wherein the amount of the curing promoter is from 0.01 to 5% by weight, relative to the total weight of the flame retarding epoxy resin composition.

14. The flame retarding epoxy resin composition according to claim 11, which further comprises other epoxy resin selected from the group consisting of bisphenol glycidyl ether, bis(diphenol) glycidyl ether, resorcinol glycidyl ether, glycidyl ether of a nitrogen-containing ring, glycidyl ether of dihydroxynaphthalene, phenolic polyglycidyl ether, and polyhydroxy phenol polyglycidyl ether.

15. The flame retarding epoxy resin composition according to claim 14, wherein the amount of the other epoxy resin is from 1 to 95% by weight, relative to the total weight of the epoxy resin contained in the flame retarding epoxy resin composition.

16. The flame retarding epoxy resin composition according to claim 11, wherein the curing agent is selected from the group consisting of bisphenol resin, polyhydroxy phenol resin, phenolic resin, and anhydride.

17. The flame retarding epoxy resin composition according to claim 11, which further comprises a nitrogen- and phosphorus-containing curing agent of the following formula:

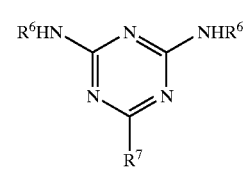

(3)

wherein $R^7$ represents a group of formula —$NHR^6$, $C_{1-6}$ alkyl group or $C_{6-10}$ aryl group;

$R^6$ represents a hydrogen atom, a group of the formula —$(CH_2R^8)_rH$, or a group of following formula (5), provided that at least one R6 is not a hydrogen atom, in which $R^8$ represents a phenylene group, a naphthalene group, or a group of formula (4):

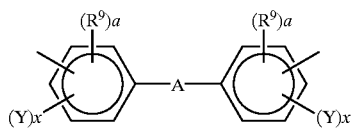

(4)

wherein r represents 0(zero) or an integral of from 1 to 20; A represents —O—, —S—, —SO$_2$—, —CO—, —CH$_2$—, —C(CH$_3$)$_2$— or a group of the following formula:

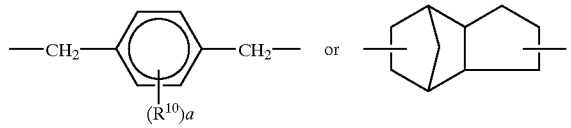

in which $R^9$ and $R^{10}$ independently represents a hydrogen atom, a $C_{1-10}$ alkyl group, or a $C_{6-10}$ aryl group; Y represents —OH, —NH$_2$, or —COOH; a represents 0(zero) or an integral of from 1 to 2; x represents 0(zero) or an integral of from 1 to 3;

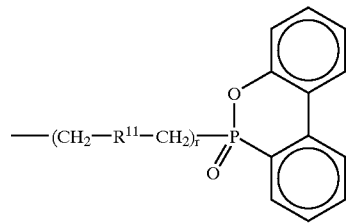

(5)

in which $R^{11}$ is defined as the definition for $R^8$ and r is defined as above.

18. The flame retarding epoxy resin composition according to claim 11, which further comprises a red phosphorus, triphenyl phosphate (TPP), tricresyl phosphate (TCP), polyammonium phosphate, and melamine dimer and trimer as flame retarding agent.

19. The flame retarding epoxy resin composition according to claim 11, which further comprises other additives selected from the group consisting of inorganic filler, coupling agent, pigment, molding release agent and low stress additives.

20. A flame retarding epoxy resin composition comprising the flame retarding nitrogen-containing epoxy resin according to claim 1 and a phosphorus-containing flame retarding agent of the following formula:

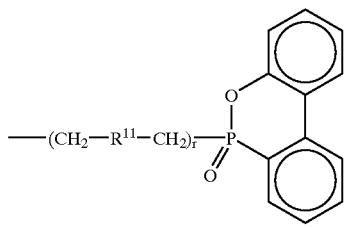

(5)

wherein $R^1$ represents —O—, —NH$_2$—, —S—, —COO—, —SO$_2$—, —CO—, CH$_3$CON<; Ar represents a phenylene group, a biphenylene group, a bisphenol divalent group, a polyphenol divalent group, a divalent group selected from the following formulae:

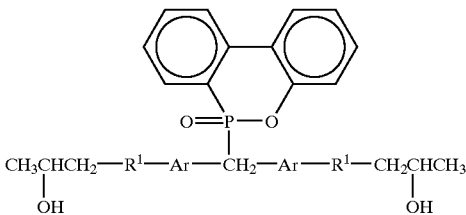

wherein $R^2$ represents a hydrogen atom, a $C_{1-6}$ alkyl or $C_{6-10}$ aryl;

$R^3$ represents —OH, —NH$_2$, —SH, —COOH, —SO$_3$H, —CHO, —NHCOCH$_3$;

$R^4$ represents —CH$_2$—, —(CH$_3$)$_3$C—, —SO$_2$—, —CO—, —O—;

m represents an integer of 0 to 2, and n represents an integer of 1 to 20.

21. An article cured from the flame retarding epoxy resin composition according to anyone of claims 11–20 at a temperature of from 50 to 350° C.

* * * * *